(12) United States Patent  (10) Patent No.: US 8,159,360 B2
Feight  (45) Date of Patent: *Apr. 17, 2012

(54) FAULTED CIRCUIT INDICATOR WITH FAULT CHARACTERISTIC DETECTION AND DISPLAY

(75) Inventor: Laurence V. Feight, Island Lake, IL (US)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 441 days.

This patent is subject to a terminal disclaimer.

(21) Appl. No.: 12/394,954

(22) Filed: Feb. 27, 2009

(65) Prior Publication Data

US 2009/0219163 A1    Sep. 3, 2009

Related U.S. Application Data

(60) Provisional application No. 61/032,866, filed on Feb. 29, 2008.

(51) Int. Cl.
  *G08B 21/00* (2006.01)
(52) U.S. Cl. ............... 340/635; 340/539.26; 340/815.45
(58) Field of Classification Search .................. 340/635, 340/657, 664, 539.1, 815.45, 815.4, 650, 340/653, 3.43, 3.1, 531, 539.26
  See application file for complete search history.

(56) References Cited

U.S. PATENT DOCUMENTS

| | | | |
|---|---|---|---|
| 3,676,740 A | 7/1972 | Schweitzer | |
| 3,702,966 A | 11/1972 | Schweitzer | |
| 3,708,724 A | 1/1973 | Schweitzer | |
| 3,715,742 A | 2/1973 | Schweitzer | |
| 3,725,832 A | 4/1973 | Schweitzer | |
| 3,781,682 A | 12/1973 | Schweitzer | |
| 3,816,816 A | 6/1974 | Schweitzer | |
| 3,866,197 A | 2/1975 | Schweitzer | |
| 3,876,911 A | 4/1975 | Schweitzer | |
| 3,906,477 A | 9/1975 | Schweitzer | |
| 4,063,171 A | 12/1977 | Schweitzer | |
| 4,152,643 A | 5/1979 | Schweitzer | |
| 4,234,847 A * | 11/1980 | Schweitzer | 324/146 |
| 4,298,864 A * | 11/1981 | Mahnke et al. | 340/657 |
| 4,375,617 A | 3/1983 | Schweitzer | |
| 4,438,403 A | 3/1984 | Schweitzer | |
| 4,456,873 A | 6/1984 | Schweitzer | |
| 4,458,198 A | 7/1984 | Schweitzer | |
| 4,495,489 A | 1/1985 | Schweitzer | |
| 4,794,329 A | 12/1988 | Schweitzer | |
| 4,794,331 A | 12/1988 | Schweitzer | |
| 4,794,332 A | 12/1988 | Schweitzer | |
| 4,795,982 A | 1/1989 | Schweitzer | |
| 4,873,706 A | 10/1989 | Schweitzer | |

(Continued)

OTHER PUBLICATIONS

Horstmann GmbH 2006 Edition Product Category Retrieved date Mar. 4, 2009 http:mvtechnology.com.au/Download%20Library/Catalogue%20SCI%20&20EFI%20Edition%202006..pdf.

(Continued)

*Primary Examiner* — Daniel Previl
(74) *Attorney, Agent, or Firm* — Eugene M. Cummings, P.C.

(57) ABSTRACT

A display for a faulted circuit indicator is disclosed. A plurality of light-emitting diodes is arranged so that at least two diodes are visible to a person approaching the faulted circuit indicator from a determined angle of approach. When a fault is detected, the faulted circuit indicator flashes the plurality of light-emitting diodes in a progression pattern to indicate the direction to the fault relative to the faulted circuit indicator.

13 Claims, 9 Drawing Sheets

U.S. PATENT DOCUMENTS

| | | | |
|---|---|---|---|
| 4,904,932 A | 2/1990 | Schweitzer | |
| 4,984,124 A | 1/1991 | Yeh | |
| 5,008,651 A | 4/1991 | Schweitzer | |
| 5,045,778 A | 9/1991 | Thibodeau | |
| 5,070,301 A | 12/1991 | Schweitzer | |
| 5,077,520 A | 12/1991 | Schweitzer | |
| 5,095,265 A | 3/1992 | Schweitzer | |
| 5,153,565 A | 10/1992 | Schweitzer | |
| 5,168,414 A | 12/1992 | Horstmann | |
| 5,180,972 A | 1/1993 | Schweitzer | |
| 5,220,311 A | 6/1993 | Schweitzer | |
| 5,274,324 A | 12/1993 | Schweitzer | |
| 5,363,088 A | 11/1994 | Schweitzer | |
| 5,406,195 A | 4/1995 | Schweitzer | |
| 5,420,502 A | 5/1995 | Schweitzer | |
| 5,677,623 A | 10/1997 | Schweitzer | |
| 5,677,678 A | 10/1997 | Schweitzer | |
| 5,729,125 A | 3/1998 | Schweitzer | |
| 5,754,383 A | 5/1998 | Huppertz | |
| 5,821,869 A | 10/1998 | Schweitzer | |
| 5,889,399 A | 3/1999 | Schweitzer | |
| 5,920,451 A * | 7/1999 | Fasano et al. | 361/45 |
| 5,959,537 A | 9/1999 | Banting | |
| 5,990,674 A | 11/1999 | Schweitzer | |
| 6,014,301 A | 1/2000 | Schweitzer | |
| 6,016,105 A | 1/2000 | Schweitzer | |
| 6,043,433 A | 3/2000 | Schweitzer | |
| 6,133,723 A | 10/2000 | Feight | |
| 6,133,724 A | 10/2000 | Schweitzer | |
| 6,211,764 B1 | 4/2001 | Schweitzer | |
| 6,429,661 B1 | 8/2002 | Schweitzer | |
| 6,433,698 B1 | 8/2002 | Schweitzer | |
| 6,479,981 B2 * | 11/2002 | Schweitzer et al. | 324/133 |
| 6,734,662 B1 | 5/2004 | Fenske | |
| 6,798,211 B1 * | 9/2004 | Rockwell et al. | 324/527 |
| 6,822,576 B1 | 11/2004 | Feight | |
| 6,894,478 B1 * | 5/2005 | Fenske | 324/127 |
| 6,949,921 B1 | 9/2005 | Feight | |
| 6,963,197 B1 | 11/2005 | Feight | |
| 7,023,691 B1 | 4/2006 | Feight | |
| 7,053,601 B1 | 5/2006 | Fenske | |
| 7,106,048 B1 | 9/2006 | Feight | |
| 7,205,495 B2 | 4/2007 | Mazur | |
| 7,248,158 B2 | 7/2007 | Berkman | |
| 2005/0040809 A1 * | 2/2005 | Uber et al. | 324/117 R |
| 2009/0009180 A1 | 1/2009 | Varghai | |
| 2009/0039788 A1 * | 2/2009 | Smith et al. | 315/86 |

OTHER PUBLICATIONS

PCT, International Search Report for PCT/US2009/035502, May 27, 2009.

PCT, Written Opinion of the International Searching Authority, May 17, 2009.

2006 Edition Product Category. Dipl.-ing. H. Horstmann Gmbh [retrieved on Mar. 4, 2009]. Retrieved from the internet: <URL: http://www.mvtechnology.com.au/Download%20Library/Catalogue%20SCI%20&%20EFI%20Edition%20202006..pdf>.

PCT, International Search Report for PCT/US2009/035509, Apr. 28, 2009.

PCT, Written Opinion of the International Searching Authority for PCT/US2009/035509, Apr. 28, 2009.

* cited by examiner

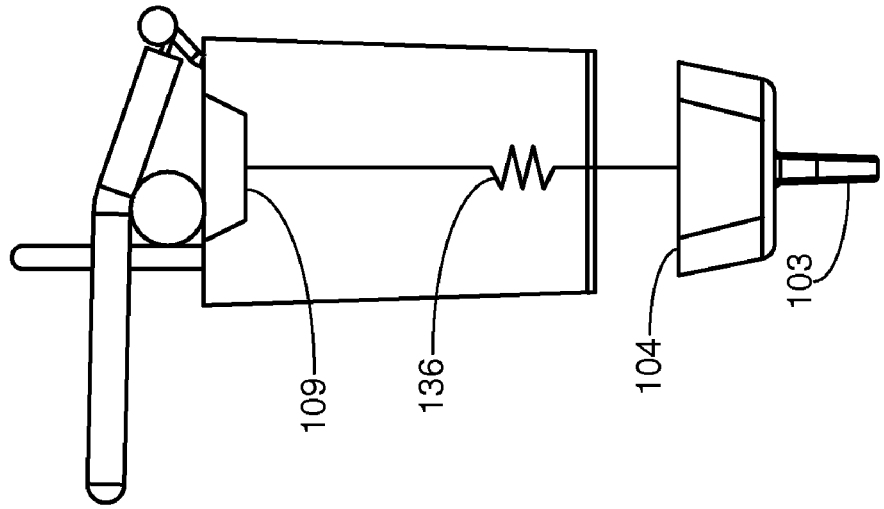
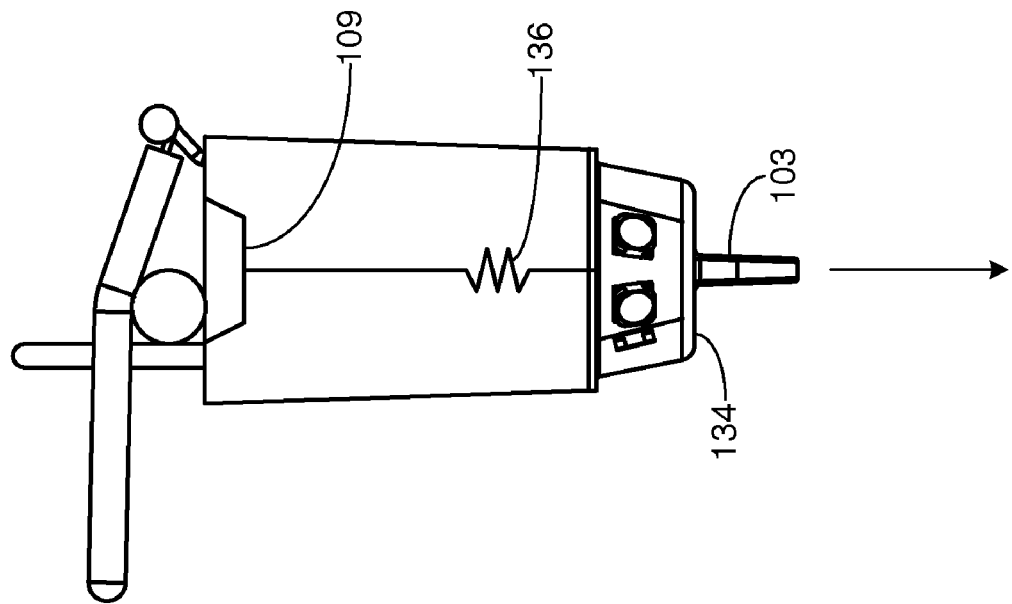

FAULTED CIRCUIT INDICATOR WITH FAULT CHARACTERISTIC DETECTION AND DISPLAY

CROSS-REFERENCE TO RELATED APPLICATIONS

This application claims priority under 35 U.S.C. §119(e) to U.S. Provisional Application 61/032,866, entitled "FAULTED CIRCUIT INDICATOR WITH FAULT CHARACTERISTIC DETECTION & DISPLAY," filed on Feb. 29, 2008 on behalf of inventor Laurence Virgil Feight.

FIELD OF THE INVENTION

The present invention relates generally to systems, apparatus, and methods for indicating the presence of a fault in a power transmission or distribution system, and more particularly, to systems, apparatus, and methods for indicating the direction to a fault on a faulted circuit indicator, and more particularly still to systems, apparatus, and methods for indicating the direction to a fault by lighting and darkening a sequence of lamps in a specified order.

DESCRIPTION OF THE PRIOR ART

Various types of self-powered faulted circuit indicators ("FCIs") have been constructed for detecting electrical faults in power distribution systems, including clamp-on type fault indicators, which clamp directly over cables in the systems and may derive their operating power from inductive and/or capacitive coupling to the monitored conductor; and test point type fault indicators, which are mounted over test points on cables or associated connectors of the systems and may derive their operating power from capacitive coupling to the monitored conductor. Other prior art FCIs may be either of the manually resetting type, wherein it is necessary that the indicators be physically reset, or of the self-resetting type, wherein the indicators are reset upon restoration of line current. Examples of such FCIs are found in certain products manufactured by Schweitzer Engineering Laboratories, as well as described in U.S. Pat. Nos. 3,676,740, 3,906,477, 4,063,171, 4,234,847, 4,375,617, 4,438,403, 4,456,873, 4,458,198, 4,495,489, 4,974,329, 5,220,311, 5,677,678, 6,016,105, 6,133,723, 6,133,724, 6,822,576, 6,949,921, 6,963,197, 7,023,691, 7,053,601, 7,106,048, 7,271,580, and 7,315,169, all of which are hereby incorporated by reference.

Detection of fault currents in a monitored conductor by an FCI is typically accomplished by magnetic switch means, such as a magnetic reed switch, in close proximity to the conductor being monitored. Upon occurrence of an abnormally high fault-associated magnetic field around the conductor, the magnetic switch actuates a trip circuit that produces current flow in a trip winding to position an indicator flag visible from the exterior of the indicator to a trip or fault indicating position. Upon restoration of current in the conductor, a reset circuit is actuated to produce current flow in a reset winding to reposition the target indicator to a reset or non-fault indicating position, or the FCI may be manually reset. In addition, some prior art FCIs have distinguished between the display of temporary faults and permanent faults. For example, the Schweitzer Engineering Laboratories Model AR-OH ("AutoRANGER") uses two downward facing red light-emitting diodes (LEDs) to indicate a permanent fault, and a single yellow LED to indicate a temporary fault.

Various prior art FCIs have utilized LEDs. Generally, FCIs are small, battery-powered devices, and therefore, fully illuminating a high-intensity LED during daylight hours may quickly consume the battery of the FCI. In addition, the physical construction of FCIs has usually involved placing LEDs on the bottom or one of the sides of the FCI, making daytime visibility difficult if a lineman is not facing the appropriate surface of the FCI.

Prior art FCIs have also indicated the direction of a suspected fault, particularly when deployed on circuits that have parallel conductor sections. These types of FCIs respond to fault level currents, but also detect the direction of power flow, and, when a fault is indicated, indicate the direction of power flow while the fault occurred. Prior art solutions include the use of a pointer-type display, or the use of one color, such as green, to indicate one side of a fault, and another color, such as red, to indicate the other side of a fault. Using the last solution, a line crew would know that the power line segment located between green and red displaying FCIs would contain the fault. However, these solutions suffer from a variety of problems. Pointer type displays have poor visibility during daytime hours. The use of different color LEDs (where a single FCI illuminates only a single color of IED depending on which side of the fault the FCI is located) does not actually indicate the direction of a fault; two FCIs displaying different colored LEDs must be located before the fault's direction can be determined.

OBJECTS OF THE INVENTION

Accordingly, it is an object of this invention to provide an apparatus for better displaying a fault indication, as well as traits of a detected fault.

Another object of this invention is to provide an apparatus for indicating the direction to a fault.

Another object of this invention is to provide an apparatus for visually indicating the direction to a fault so that maintenance personnel can tell the direction to the detected fault while still at a distance from the indicating device.

Other advantages of the disclosed invention will be clear to a person of ordinary skill in the art. It should be understood, however, that a system, method, or apparatus could practice the disclosed invention while not achieving all of the enumerated advantages, and that the protected invention is defined by the claims.

SUMMARY OF THE INVENTION

The disclosed invention achieves these objectives by providing a faulted circuit indicator with a sophisticated display comprised of a plurality of high-intensity light-emitting diodes ("LEDs") arranged so that at least two diodes will be visible to a person approaching the faulted circuit indicator from a determined angle of approach. An angle of approach is determined at the time that the FCI is installed on the power line. The person installing the FCI may determine the angle of approach based on the location of the power line, location of or direction to an access road to the power line, or the like. The use of high-intensity LEDs provides excellent visibility, even during daytime hours, and the use of a flashing pattern limits battery usage to acceptable levels. In one embodiment, the faulted circuit indicator comprises a housing, a current acquisition circuit disposed within the housing, and a monitoring circuit coupled to the current acquisition circuit for determining the occurrence of a fault on a monitored power line. When a fault is detected, the monitoring circuit then flashes a plurality of LEDs in a pattern, wherein the LEDs are disposed on or in the faulted circuit indicator so that at least two LEDs are visible regardless of the angle of approach of a person.

The faulted circuit indicator may further include a clear end cap, and the plurality of LEDs could be disposed within the clear end cap. The end cap would hang downward when installed so that the LEDs would be visible to any approaching personnel. In one embodiment, there would be six LEDs disposed on a flexible printed circuit board attached to a hexagonal post within the faulted circuit indicator. Each LED would be disposed on a separate face of the hexagonal post. When attached to a power line, the LEDs could be divided into three separate sets. The first set would be the pair of left-most LEDs. The second set would be the pair of centered LEDs. The third set would be the pair of right-most LEDs. When a fault is detected, the monitoring circuit drives the sets in a pattern to indicate the direction of the fault relative to the faulted circuit indicator. For example, if the fault is to the right of the faulted circuit indicator, the first set of LEDs is flashed, then the second, and then the third, giving the impression of progression towards the fault.

Another embodiment of the disclosed invention may incorporate a rotatable display. With such a display, fewer LEDs may be used, thereby allowing for longer battery life. Furthermore, while fewer LEDs allows the faulted circuit indicator to be visible over a more narrow field of view, the rotatable display allows the LEDs to be positioned so that they may be viewed from a determined angle of approach by line personnel.

BRIEF DESCRIPTION OF THE DRAWINGS

Although the characteristic features of this invention will be particularly pointed out in the claims, the invention itself, and the manner in which it may be made and used, may be better understood by referring to the following description taken in connection with the accompanying drawings forming a part hereof, wherein like reference numerals refer to like parts throughout the several views and in which:

FIG. 7A is an exploded perspective view of a clamp on faulted circuit indicator incorporating a rotatable display constructed in accordance with an embodiment of the disclosed invention;

FIG. 7B is an additional exploded perspective view of the faulted circuit indicator depicted in FIG. 7A, showing the rotatable display fully extended and rotated so that none of the light-emitting diodes in the display are visible;

DETAILED DESCRIPTION OF THE ILLUSTRATED EMBODIMENT

Figure 1:
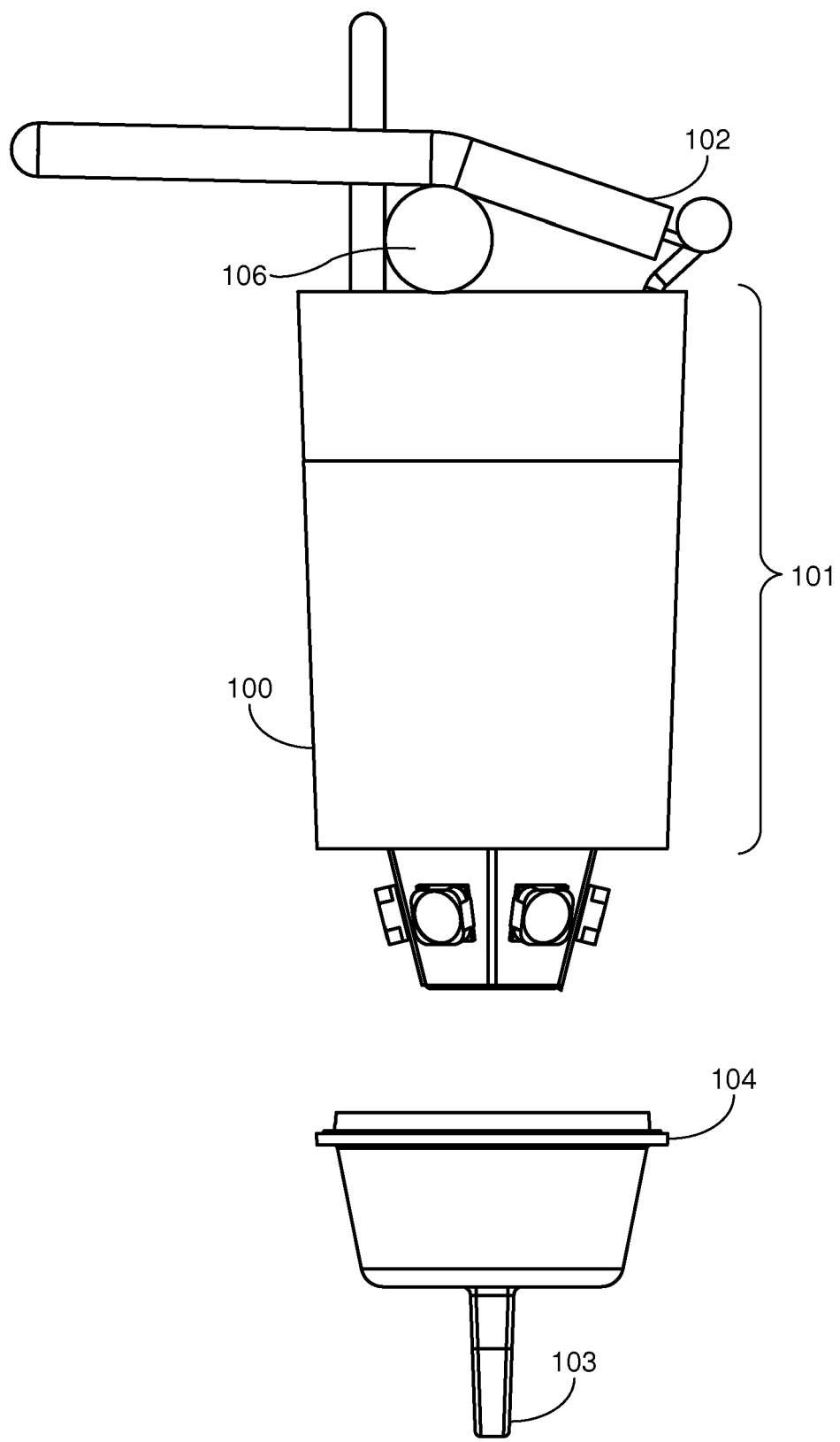
FIG. 1 is a side view of a clamp-on faulted circuit indicator including a display constructed in accordance with the disclosed invention.

Turning to the Figures, and to FIG. 1 in particular, a faulted circuit indicator 100 constructed in accordance with the present invention is depicted. Faulted circuit indicator 100 includes a housing 101 containing circuitry for sensing power flow in a power line (not shown) and for indicating when fault currents are sensed. A clamp 102 is coupled to the housing 101 by a spring mechanism allowing the clamp 102 to pivot. The clamp 102 couples the faulted circuit indicator 100 to the power line (not shown).

The faulted circuit indicator includes an end cap 104 with a protruding eye 103, which allows for the use of a hot stick during installation or removal. As drawn, the end cap 104 is not joined to the housing 101, but would, in a finished product, be sealed to the housing 101. The end cap 104 may be joined to the housing 101 by a number of prior art methods, such as sonic welding, but preferably is joined so that moisture and other contaminants cannot access the interior of the faulted circuit indicator 100. When installed on a power line, fault indicator 100 normally hangs so that the eye 103 is roughly perpendicular to the ground. This allows end cap 104 to be seen from any direction by approaching line personnel.

The fault detecting circuitry of the faulted circuit indicator 100 may operate in accordance with any prior art fault detection means, such as that disclosed in U.S. application for patent Ser. No. 11/578,334, which is assigned to Schweitzer Engineering Laboratories, Inc., the assignee of the present application, and is hereby incorporated by reference. In addition, the FCI 100 contains a fault direction sensing circuit including a line voltage sensor, such as the circuit disclosed within U.S. Pat. No. 5,220,311, which is hereby incorporated by reference.

Figure 2:
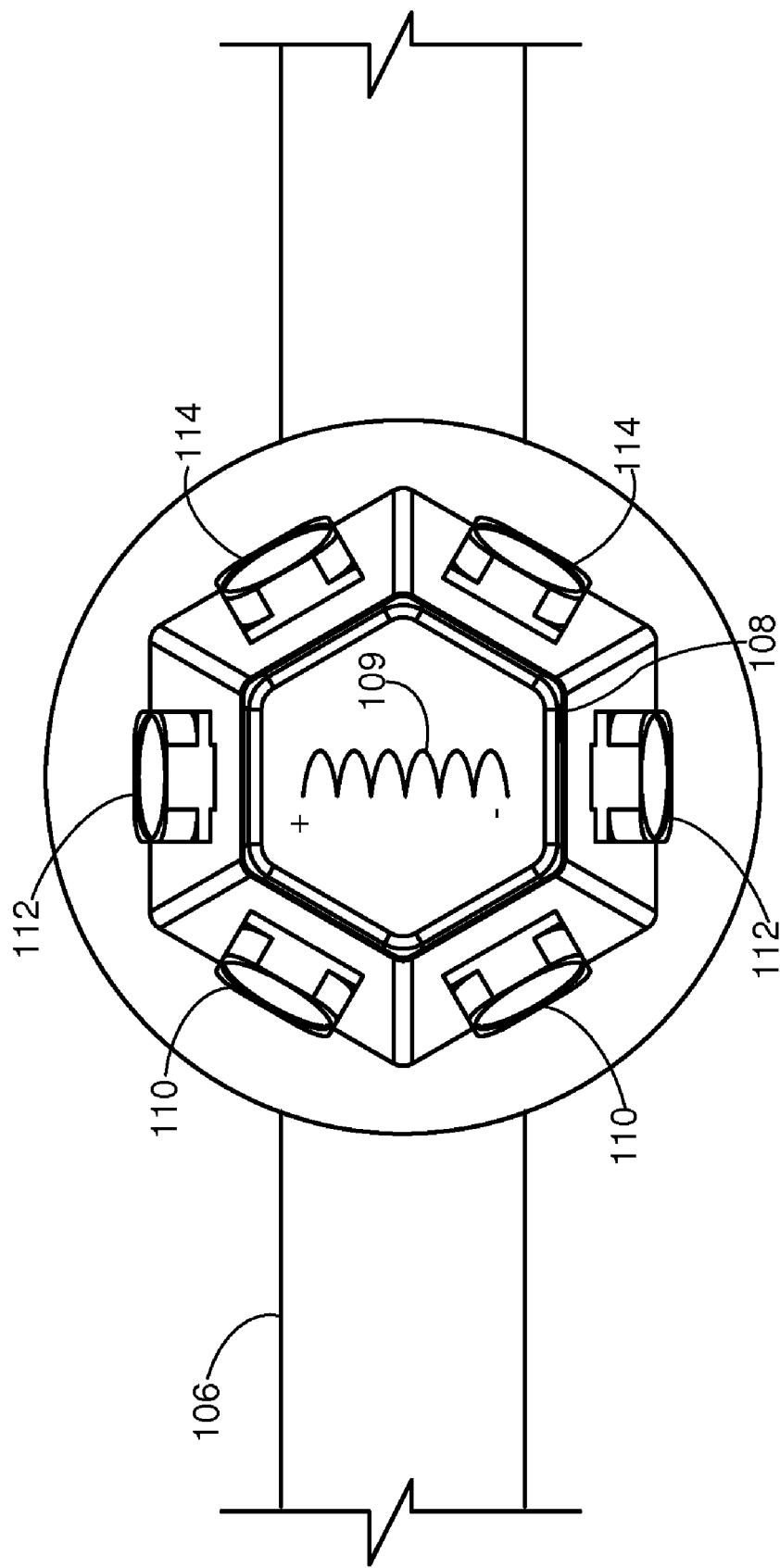
FIG. 2 is an exploded bottom view of the display of the faulted circuit indicator depicted in FIG. 1 installed on a power line, particularly showing the layout of light-emitting diodes in the display of the faulted circuit indicator in relation to the power line, in accordance with an embodiment of the disclosed invention.

Turning to FIG. 2, the bottom of faulted circuit indicator 100 is displayed for an FCI installed on a power line 106, and in particular, six light-emitting diodes ("LEDs") 110,112,114 are shown in a hexagonal pattern. The LEDs 110,112,114 are mounted on a PC-board (not shown) affixed to a hexagonal mounting post 108. To improve visibility, the LEDs 110,112, 114 may be high intensity 120 degree LEDs, even though each LED only covers a 60 degree arc. In addition, the faulted circuit indicator 100 is mounted to a power line 106 by clamp 102, which is designed to bring voltage coil 109 into close proximity with power line 106. As the current in the power line 106 increases, the voltage across coil 109 increases as well. The direction of power flow is determined by comparing the phase of the current with a voltage corresponding to the power line voltage that is sensed by the line voltage sensing circuit; when the direction of the power changes, the polarity of the measured instantaneous line voltage flips as well.

Figure 3:
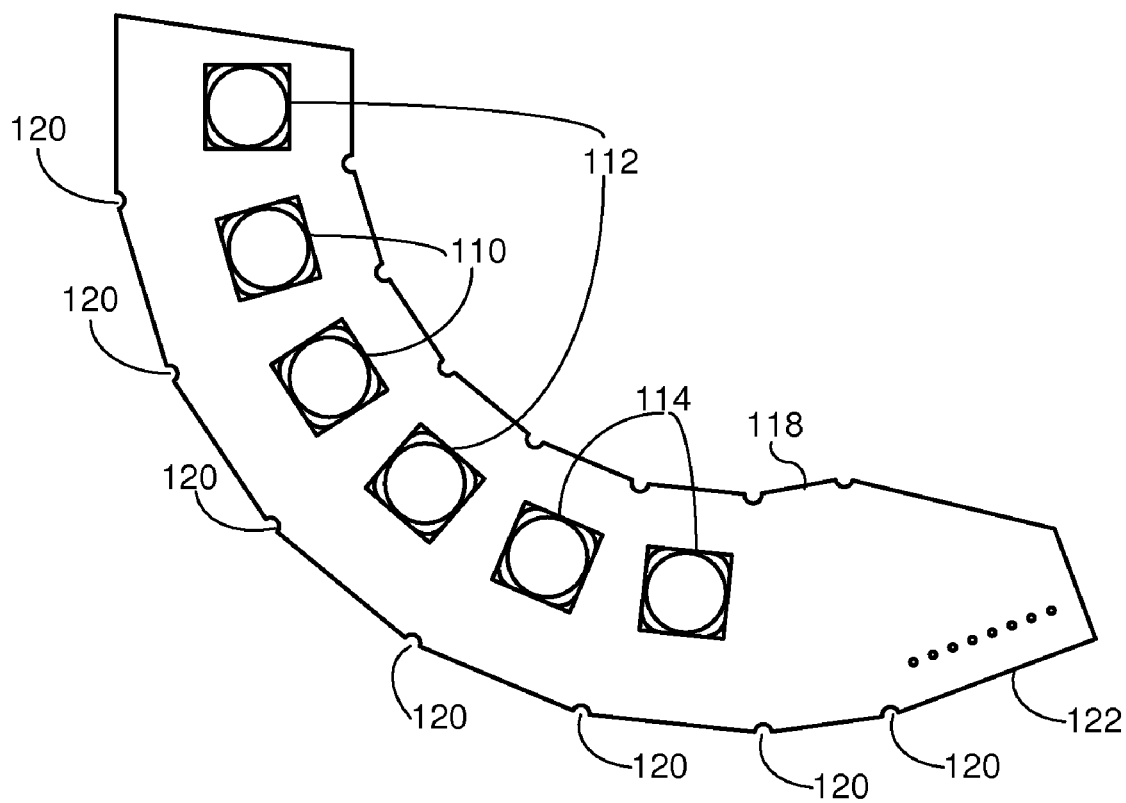
FIG. 3 depicts a flexible printed circuit board including the light-emitting diodes visible in FIG. 2, in accordance with an embodiment of the disclosed invention.

FIG. 3 depicts a flexible printed circuit board 118 populated with six LEDs 110,112,114 and various other components. The circuitry driving the six LEDs 110,112,114 may be any suitable prior art circuit. As shown, the printed circuit board 118 has seven-sections as delineated by tabs 120 and a terminating tab 122. The sections and tab 122 are adapted to wrap around hexagonal post 108.

Figure 4A:
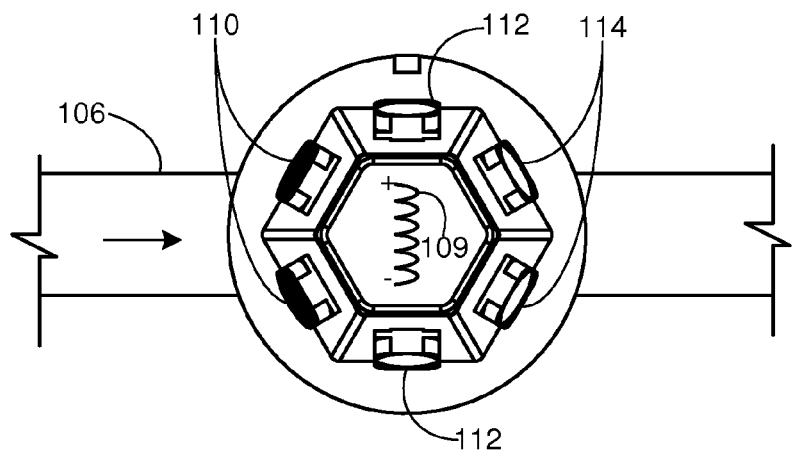
FIGS. 4A-4C depict an exploded bottom view of the faulted circuit indicator depicted in FIG. 2, displaying one possible pattern or sequence of flashing the light-emitting diodes included within the FCI's display to indicate that power flowed in the power line from left to right at the time that a fault was detected, in accordance with an embodiment of the disclosed invention.
Figure 4B:
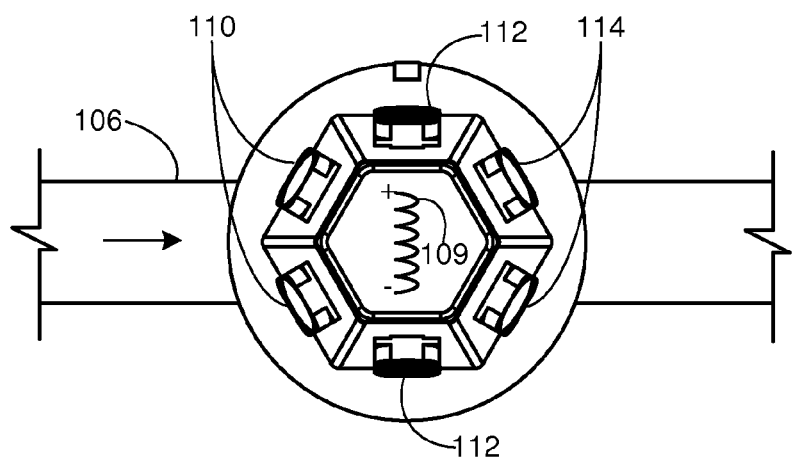
Figure 4C:
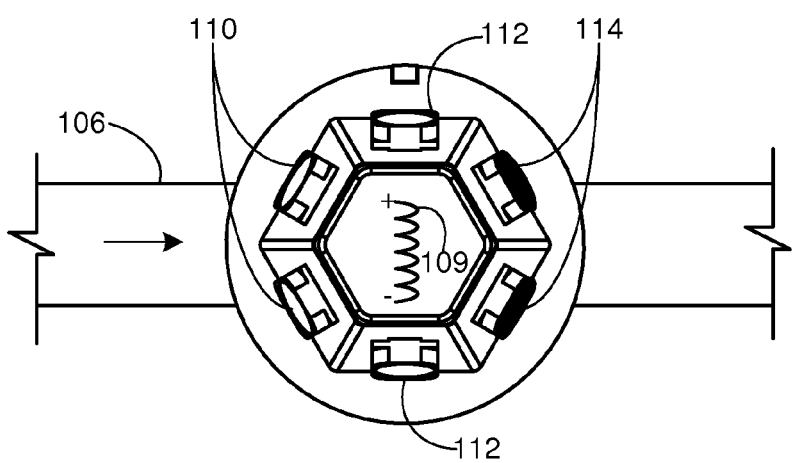

In an embodiment of the disclosed invention that applicant believes is especially suited for indicating the direction of a fault relative to the FCI 100, all of the LEDs 110,112,114 may be the same color, for example, red. In this embodiment, the direction of the progression pattern discussed below indicates the direction of a detected fault relative to the FCI. Turning to FIG. 4A, an FCI embodying the disclosed invention is shown attached to a power line 106 where a fault has occurred while power was flowing from left to right. As power was flowing from left to right at the time of the fault, the fault will generally be located to the right of the FCI on the power line. Furthermore, the voltage sensed by the line voltage sensor will be substantially in phase with the sensed current, which, in the particular depicted embodiment, indicates that the fault lies to the right. Accordingly, to indicate that the fault lies to the right of the FCI 100, the LEDs 110,112,114 will be illuminated in a progression pattern from left to right. Accordingly, the left-most LEDs 110 are illuminated first, as shown in FIG. 4A. The left-most LEDs 110 will be illuminated for a time period T1, and then darkened. After a darkening time period T2 has elapsed, the center LEDs 112 will be illuminated, again for a time period T1. After another darkening time period T2, the right-most LEDs 114 will illuminated for a time period T1, and then darkened. Following this a flash-cycle time period T3 will be allowed to elapse, prior to repeating the pattern, starting with illuminating the left-most LEDs 110. It should be noted that if the FCI is mounted in the opposite direction, i.e., so that the LEDs denoted 110 are positioned right-most, the display will still show the fault in the correct direction. This is because the polarity of the sensed voltage will be reversed when the direction of the FCI is reversed. Therefore, relative to the FCI, power is flowing in the opposite direction, and accordingly, the sensed current will be substantially out of phase with the voltage reference. The voltage reference may be sensed by the line voltage sensor. As this indicates that the fault is to the left relative to the FCI, the LEDs denoted 114 will be activated first, followed by the centered LEDs 112, and the LEDs denoted 110 last. Therefore, with the FCI mounted in the reverse direction, the direction of the fault is still displayed correctly.

Figure 5A:
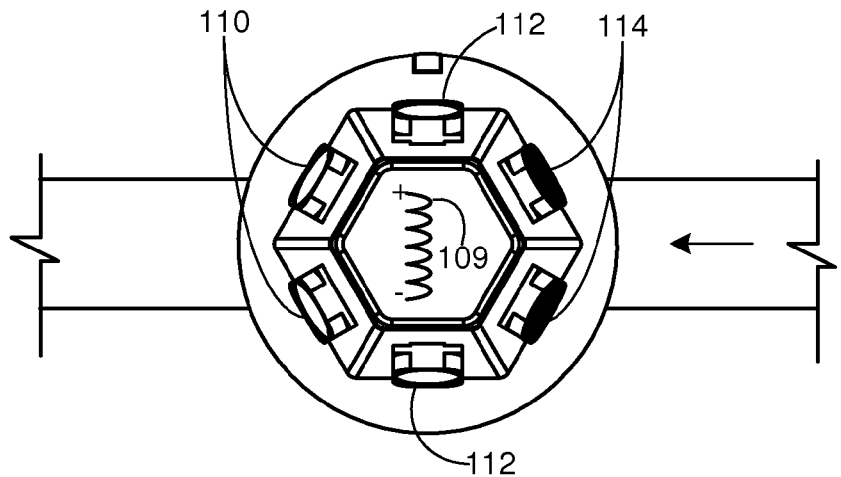
FIGS. 5A-5C depict an exploded bottom view of the faulted circuit indicator depicted in FIG. 2, displaying one possible pattern or sequence of flashing the light-emitting diodes included within the FCI's display to indicate that power flowed in the power line from right to left at the time that a fault was detected, in accordance with an embodiment of the disclosed invention.
Figure 5B:
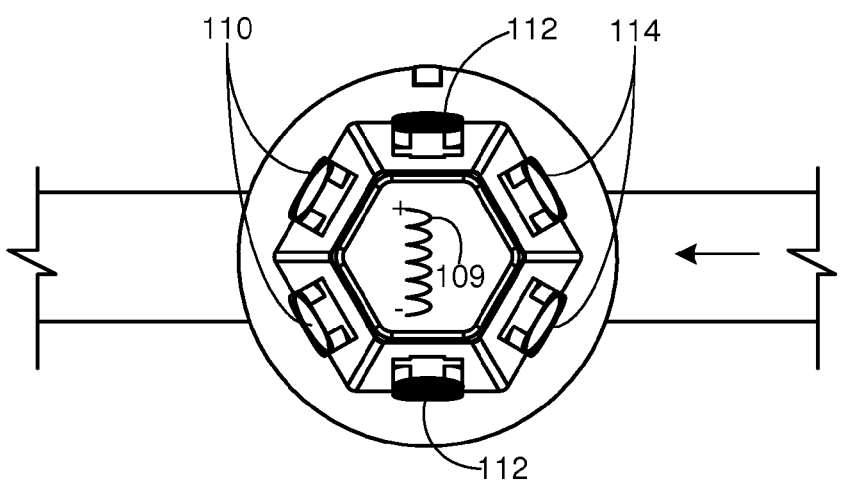
Figure 5C:
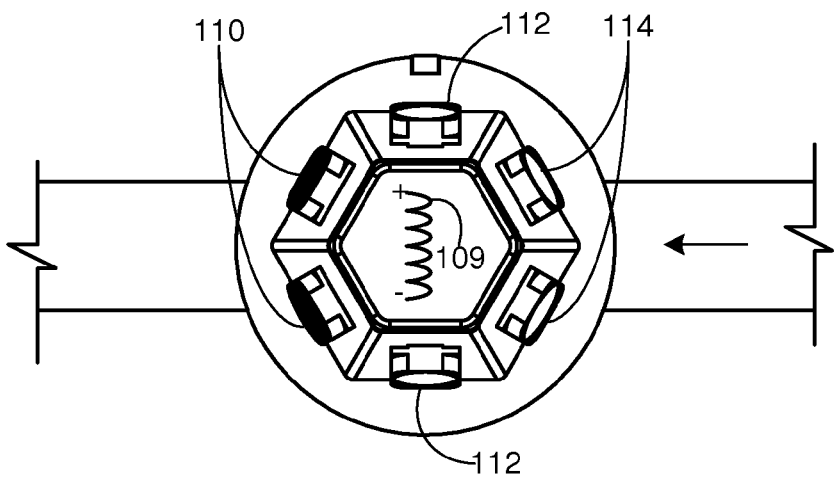

FIGS. 5A-5C depict the pattern of progression that will be displayed by the LEDs 110,112,114 if, at the time a fault was sensed, power was flowing from right to left, indicating that the fault was to the left relative to the FCI. FIG. 5A depicts the first step of the progression pattern, which is illuminating the right-most LEDs 114 for a time period T1. The right-most LEDs 114 are then darkened for a time period T2, and the center LEDs 112 are illuminated for a time period T1. The center LEDs 112 are then darkened for a time period T2 and the left-most LEDs 110 are illuminated for a time period T1. The left-most LEDs 110 are then darkened, and a flash-cycle time period T3 is allowed to elapse prior to repeating the pattern with the illumination of the right-most LEDs 114.

In regards to the above embodiment, when a fault occurs physically close to the FCI, the FCI may register fault level current but will not be able to sense the reference voltage. In such a situation, the direction of the fault relative to the FCI cannot be determined. Nonetheless, a fault has occurred, and the FCI will display an indication of a fault. However, it cannot indicate the direction of the fault. Therefore, the LEDs will display an alternate pattern. One such suitable pattern would be to flash the center LEDs 112 at a predetermined duty cycle.

Figure 6:
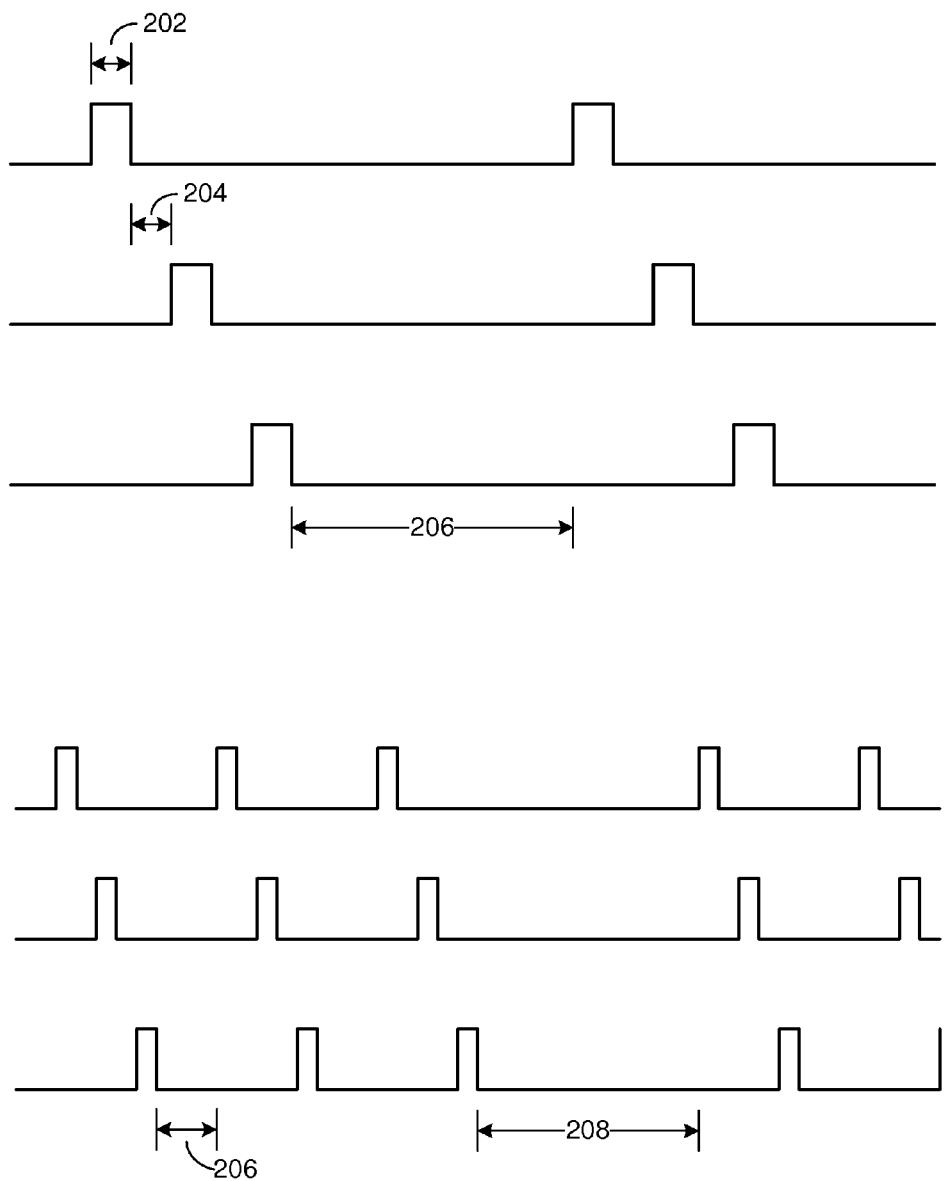
FIG. 6 depicts a sequence of timing diagrams, illustrating the chronological sequence of control signals applied to the light-emitting diodes of the faulted circuit indicator of FIG. 2 to accomplish the disclosed power flow indication pattern.

FIG. 6 shows a series of timing diagrams illustrating the temporal relation between control signals applied to different LED pairs to achieve the progression pattern disclosed above. As shown, the upper set of timing diagrams shows cyclic LED progression. The first pair of LEDs is activated for a time period 202, which could be set to 120 ms. The first pair of LEDs is then darkened for a time period 204, which could be set to 100 ms. The second pair of LEDs is then illuminated for a time period 202, and darkened for a time period 204. The third pair of LEDs is then illuminated for a time period 202. The third pair of LEDs is then darkened for a time period 206, which could be set to 600 ms, and the pattern is repeated. Assuming that the fault is to the left of the faulted circuit indicator, the first pair of LEDs would be the right-most LEDs, the second pair of LEDs would be the centered LEDs and the third pair of LEDs would be the left-most LEDs. If the fault was to the right of the faulted circuit indicator, the first pair of LEDs would be the left-most LEDs, the second pair of LEDs would be the centered LEDs and the third pair of LEDs would be the right-most LEDs.

The lower set of timing diagrams of FIG. 6 shows an alternative flash pattern. As illustrated, the pattern described above in regards to the upper set of timing diagrams is repeated three times. However, after the progression pattern has been repeated three times, the LEDs are darkened for a period of time 208, which could be set to 5000 ms. This allows for longer battery life while maintaining the advantages of the disclosed invention. However, there would be a greater chance of maintenance personnel missing the fault indication as they passed the faulted circuit indicator.

FIGS. 7A and 7B depict an FCI 100 constructed in accordance with an embodiment of the disclosed invention that is especially useful if the FCI is only going to be viewed from a known trajectory. In this embodiment, the LED display 134 is coupled to a rotatable spring 136. The LED display 134, instead of including six LEDs, includes three LEDs, effectively providing greater than 180 degrees exposure, assuming 120 degree LEDs are used. Using a hotstick with eye 103, an installer can rotate the display 134 to be visible from the direction from which an installer will approach the FCI, making the display visible from the determined direction of approach. As LEDs use large amounts of power when they are activated, an FCI constructed in accordance with this embodiment of the disclosed invention could potentially have a much greater battery life than a similar FCI using multiple LEDs mounted to cover 360 degrees. LEDs would be flashed similarly to the manner described above, except that, where a pair of LEDs is described as illuminated above, only a single LED would be illuminated. Though the display 134 may be rotated, the coil 109 stays the same relative to the power line. Rotation may be limited so as to not lose the reference to the monitored power line.

Figure 8:
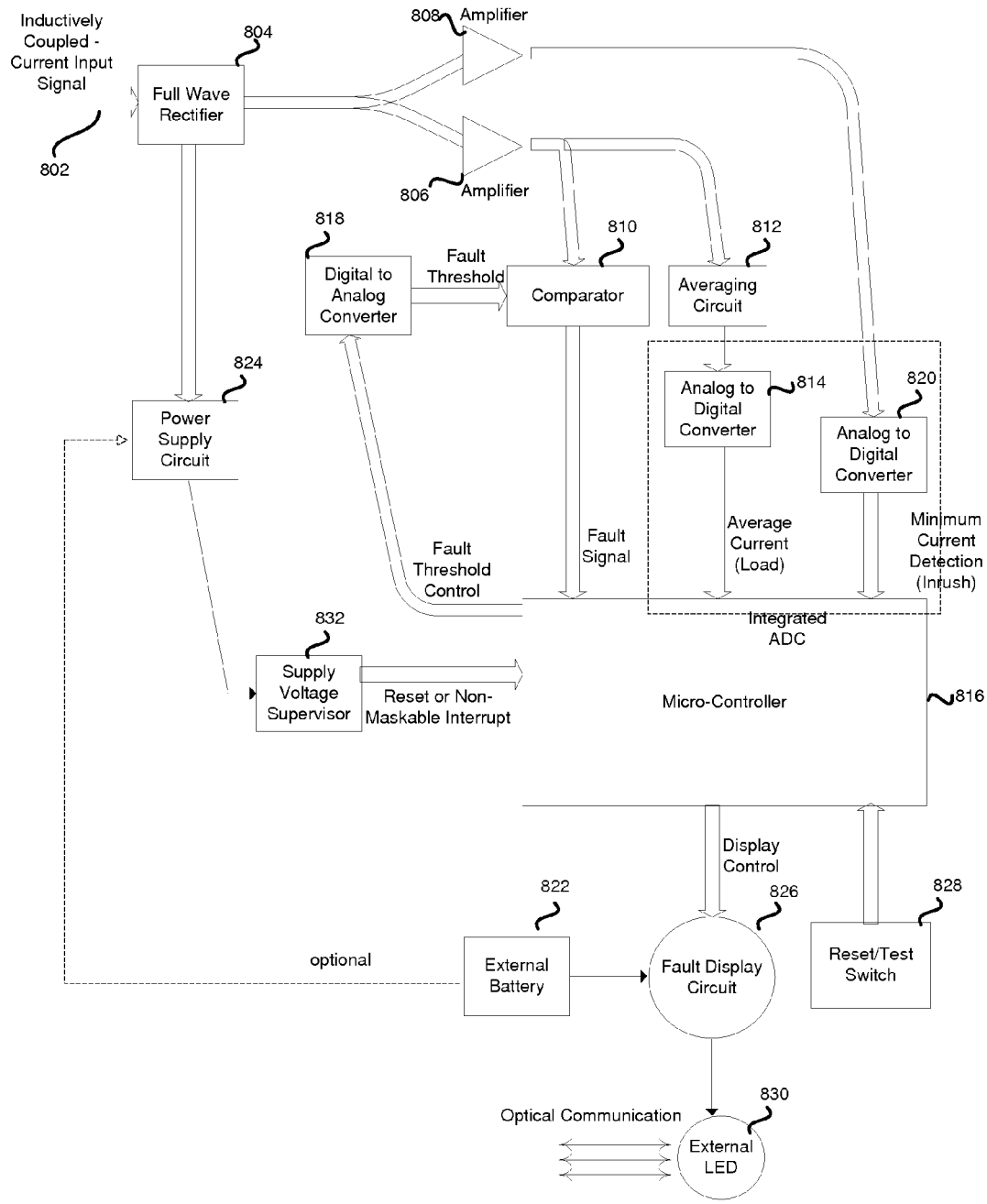
FIG. 8 is a block view of a prior art current detection and monitoring circuitry for use with a faulted circuit indicator constructed in accordance with the disclosed invention.

FIG. 8 is a block diagram of current acquisition and monitoring circuitry usable with the disclosed invention. This circuitry is identical to that disclosed in pending U.S. application Ser. No. 11/578,334, earlier incorporated by reference. The specific operation of this circuitry can be found within that reference.

Figure 9A:
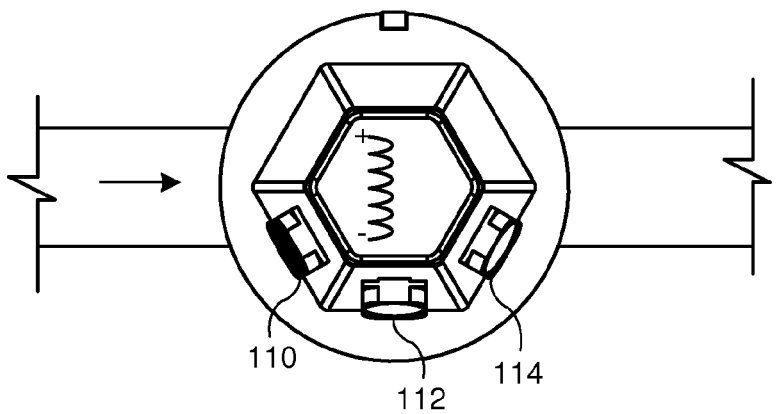
FIG. 9 is an exploded bottom view of the faulted circuit indicator depicted in FIGS. 7A and 7B.
Figure 9B:
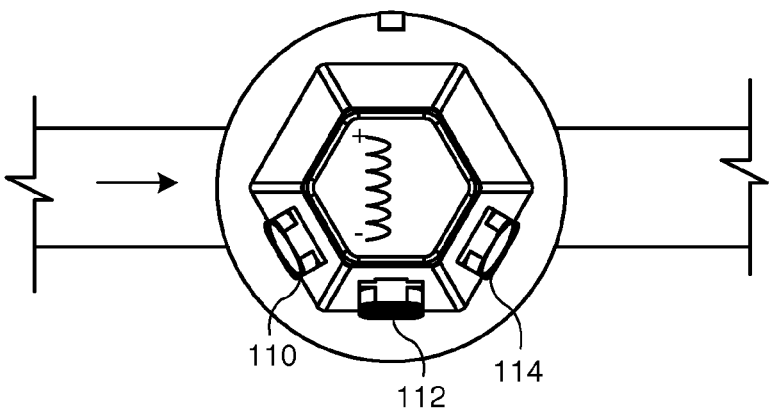
Figure 9C:
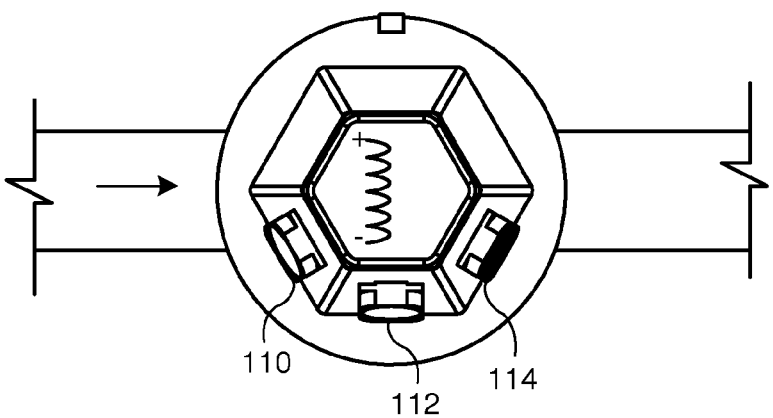

FIGS. 9A-9C depict the pattern of progression that will be displayed by the LEDs of the faulted circuit indicator of FIGS. 7A and 7B, if, at the time a fault was sensed, power was flowing from left to right, indicating that the fault was to the right relative to the FCI. FIG. 9A depicts the first step of the progression pattern, which is illuminating the left-most LED 110 for a time period T1. The left-most LED 110 is then darkened for a time period T2, and the center LED 112 is illuminated for a time period T1. The center LED 112 is then darkened for a time period T2 and the right-most LED 114 is illuminated for a time period T1. The right-most LED 114 is then darkened, and a flash-cycle time period T3 is allowed to elapse prior to repeating the pattern with the illumination of the left-most LED 110.

The foregoing description of the invention has been presented for purposes of illustration and description, and is not intended to be exhaustive or to limit the invention to the precise form disclosed. The description was selected to best explain the principles of the invention and practical application of these principles to enable others skilled in the art to best utilize the invention in various embodiments and various modifications as are suited to the particular use contemplated. It is intended that the scope of the invention not be limited by the specification, but be defined by the claims set forth below.

What is claimed is:

1. A faulted circuit indicator comprising a housing, a current acquisition circuit disposed within the housing and adapted to monitor current within a power line, and a monitor circuit for determining when a fault has occurred on the power line, the monitor circuit in communication with the current acquisition circuit and disposed within the housing, the faulted circuit indicator further comprising:
   i) a plurality of lamps coupled to the monitor circuit and disposed such that at least two lamps are visible from any determined angle of approach to the faulted circuit indicator as installed on the power line; and
   ii) said monitor circuit driving the plurality of lamps in a first predetermined flashing pattern, the first predetermined flashing pattern indicating a direction to the fault relative to the faulted circuit indicator.

2. The faulted circuit indicator of claim 1 further comprising a clear end cap disposed on an end of the housing that faces downward relative to the power line when said faulted circuit indicator is installed, the plurality of lamps disposed within the clear end cap.

3. The faulted circuit indicator of claim 1 wherein the plurality of lamps comprise six light-emitting diodes, each light-emitting diode being disposed to face outward from the faulted circuit indicator, the plurality of light-emitting diodes divided into three sets, with a first set being disposed left-most, a second set being disposed centered, and a third set being disposed right-most.

4. The faulted circuit indicator of claim 1 wherein the monitor circuit includes a sensing coil wherein the polarity of voltage across the sensing coil when a fault is determined is indicative of a direction to the fault relative to the faulted circuit indicator, and wherein the monitor circuit is adapted to first drive the set of light-emitting diodes furthest from the fault.

5. The faulted circuit indicator of claim 1, wherein the first predetermined flashing pattern comprises a progression flashing pattern.

6. The faulted circuit indicator of claim 1, wherein the monitor circuit is further configured to drive the plurality of lamps in a second predetermined flashing pattern when the direction to the fault is not determined.

7. A faulted circuit indicator comprising a housing, a current acquisition circuit disposed within the housing and adapted to monitor current within a power line, and a monitor circuit for determining when a fault has occurred on the power line, the monitor circuit coupled to the current acquisition circuit and disposed within the housing, the faulted circuit indicator further comprising:
   i) a rotatable display disposed on an end of the housing, the rotatable display adapted to rotate about an axis of the housing;
   ii) a plurality of lamps coupled to said monitor circuit and disposed within said rotatable display;
   iii) said rotatable display adapted to rotate such that at least two of said plurality of lamps are viewable from the determined angle of approach to the faulted circuit indicator;
   iv) said monitor circuit driving the plurality of lamps in a first predetermined flashing pattern, the first predetermined flashing pattern indicating a direction to the fault relative to the faulted circuit indicator.

8. The faulted circuit indicator of claim 7 wherein said rotatable display includes a clear end cap that faces downward relative to the power line when said faulted circuit indicator is installed, the plurality of lamps disposed within said clear end cap.

9. The faulted circuit indicator of claim 7 wherein the plurality of lamps comprises three light-emitting diodes, each light-emitting diode disposed to face outward from the faulted circuit indicator and wherein a first light-emitting diode is disposed left-most, a second light-emitting diode is disposed centered, and a third light-emitting diode is disposed right-most.

10. The faulted circuit indicator of claim 7 wherein the monitor circuit includes a sensing coil wherein the polarity of voltage across the sensing coil when a fault is determined is indicative of a direction to the fault relative to the faulted circuit indicator, and wherein the monitor circuit is adapted to first drive the light-emitting diode furthest from the fault.

11. The faulted circuit indicator of claim 7, wherein the first predetermined flashing pattern is a progression flashing pattern.

12. The faulted circuit indicator of claim 7, wherein the monitor circuit is configured to drive the plurality of lamps in a second predetermined flashing pattern when the direction to the fault is not determined.

13. The faulted circuit indicator of claim 7, wherein the plurality of lamps are disposed so as to not be visible from a predetermined angle to the faulted circuit indicator as installed on the power line.

* * * * *